United States Patent [19]

Schwegler et al.

[11] Patent Number: 5,473,507
[45] Date of Patent: Dec. 5, 1995

[54] CHASSIS OF A DEVICE

[75] Inventors: Tim Schwegler, Pforzheim; Juergen Haeberle, Boeblingen; Siegfried Kopp, Renningen; Johannes Mahn, Boeblingen, all of Germany

[73] Assignee: Hewlett-Packard Company, Palo Alto, Calif.

[21] Appl. No.: 216,076

[22] Filed: Mar. 21, 1994

Related U.S. Application Data

[63] Continuation of Ser. No. 988,819, Dec. 10, 1992, abandoned.

[30] Foreign Application Priority Data

Dec. 11, 1991 [EP] European Pat. Off. .............. 91121242

[51] Int. Cl.[6] ..................................... H05K 7/20
[52] U.S. Cl. .......................... 361/690; 361/679; 361/732; 361/757; 361/759
[58] Field of Search ..................... 361/679–688, 361/690, 694–695, 714, 715, 726, 730, 732, 740–742, 759, 807, 809–811, 816, 818

[56] References Cited

U.S. PATENT DOCUMENTS

| | | | |
|---|---|---|---|
| 3,715,629 | 2/1973 | Swengel, Sr. ........................... | 361/729 |
| 4,296,454 | 10/1981 | Wong ....................................... | 361/679 |
| 4,527,285 | 7/1985 | Kekas et al. ............................ | 361/732 |
| 4,585,122 | 4/1986 | Stegenga ................................. | 206/334 |
| 4,667,270 | 5/1987 | Yagi ......................................... | 361/679 |
| 4,768,286 | 9/1988 | Ketcham ................................. | 29/841 |
| 4,864,469 | 9/1989 | Boudon .................................. | 361/395 |
| 4,926,291 | 5/1990 | Sarraf ...................................... | 361/384 |

FOREIGN PATENT DOCUMENTS

| | | | |
|---|---|---|---|
| 0137306 | 8/1979 | Germany ............................... | 361/679 |
| 59-074082 | 4/1984 | Japan . | |

OTHER PUBLICATIONS

"Manufacturing Processes", Herbert W. Yankee, 1979 by Prentice–Hall, Inc., Englewood Cliffs, N.J., 07632, p. 728.
Grundig Technische Informationen, Mai 1979, Sicherhelts–Bausteine, Sicher wie ein Safe.

*Primary Examiner*—Gregory D. Thompson

[57] ABSTRACT

A chassis of a device, for example an electronic device, includes a support unit made of plastic material which carries the components of the device, such as printed circuit boards, a data storage disk, a ventilator, and a loudspeaker. The components are held in place in corresponding recesses of the chassis by a form-locking connection with the plastic material. The components are carried by the chassis without requiring any fastening elements. For assembling the device, the components are inserted into the lower part of the chassis. Thereafter, the upper part is positioned on top of the lower part. The chassis can be enclosed in a metal enclosure. The chassis is preferably manufactured by a plastic molding process. Ventilation ducts can be provided in the plastic material to ensure cooling of the components.

13 Claims, 3 Drawing Sheets

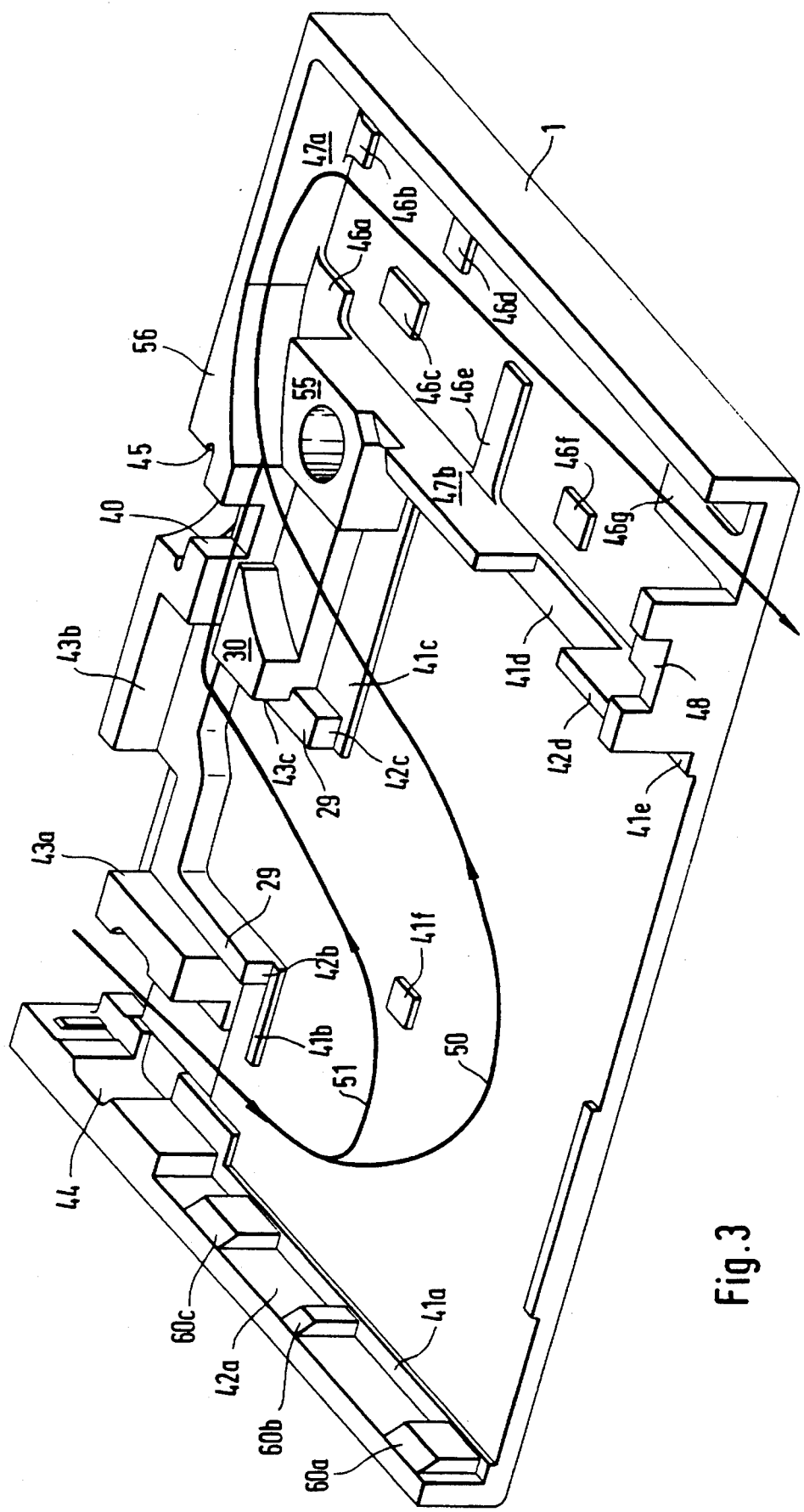

CHASSIS OF A DEVICE

This is a continuation of application Ser. No. 07/988,819, filed Dec. 10, 1992, now abandoned.

FIELD OF THE INVENTION

The invention relates to a chassis of a device, such as a computer or electronic instrument, for receiving the components of the device. The components which are typically mounted to such a chassis, in particular with electronic devices, are printed circuit boards, storage disks, ventilators, loudspeakers etc. The chassis has the purpose to hold, mechanically stable, the individual components at a fixed location inside the device.

BACKGROUND OF THE INVENTION

A chassis according to the prior art typically comprises a framework having several partitions to which the components are mounted. The framework itself is also fastened to the outer housing of the device. The manufacture of a prior art chassis and housing is a comparatively complicated and time-consuming process. For the manufacture of a metal chassis, metal sheets have to be stamped and bent. Thereafter, the surfaces of the sheets are treated, for example by galvanizing, then the sheets are connected to each other by a suitable connection technique, such as riveting, screwing, welding, or gluing. Finally, the components are connected to the chassis by fastening elements like screws or rivets or other connection techniques. It is also known to use parts of hard plastic for a chassis, but also in this case, the assembly is complicated and time-consuming since fastening elements have to be mounted to the chassis, for example by ultrasound welding, gluing, or pressing. Furthermore, electromagnetic shielding arrangements have to be provided by covering plastic parts with the conductive material and/or by fastening metal plates or foils to the chassis. Often, additional holding components, for instance angle plates, are required to hold a component at the desired position in the device. In summary, prior art chassis have a mechanically complicated structure and involve a time-consuming procedure for the manufacture of the chassis and for the assembly of the components on the chassis. In particular, known chassis require the use of mounting tools, such as screw drivers, bending tools, riveting tools, or welding tools which make the assembly costly.

Relative to the prior art, the invention solves the object to provide a chassis for a device, for example an electronic device, which permits a substantially simplified assembly.

SUMMARY OF THE INVENTION

According to the invention, the chassis comprises a support unit of plastic material having recesses which fit the outer shapes of the components, respectively, with the components being held in said support unit in a substantially form-locking manner without requiring fastening elements, and with the components being enclosed by said support unit when inserted therein.

According to an underlying principle of the invention, the chassis which holds the components of the device is completely made of plastic material and furnished with recesses into which the components fit in a form-locking manner. The components are thus held in place by the form-fitting connection to the plastic material without requiring any fastening elements like screws or rivets or clamps or snap-fits or any connection technique like welding, soldering, gluing or other permanent connection technique. The assembly of the device is simply performed by inserting the individual components into the corresponding recesses. Consequently, the assembly process is substantially simplified as compared with prior art devices where the components have to be fastened to the chassis with fastening elements. In particular, the assembly process does not require special tools; the assembly can be performed manually just by putting the individual components into the corresponding recesses. Furthermore, the assembly time is substantially reduced relative to the prior art.

The present invention has, among others, the following additional advantages:

The number of parts constituting the chassis is substantially reduced; the chassis may consist just of two or even only one part.

The requirements regarding manufacturing tolerances are smaller than in a prior art chassis wherein the parts which are to be assembled have to be manufactured with great precision to ensure accurate joining of the various parts. In the invention, however, since there is only one (or two) part(s), manufacturing tolerances are not of such an importance.

The components can easily be inserted into the chassis from one direction, preferably from above (in the direction of gravity), no complicated three-dimensional movements for positioning the components at their places in the chassis are required. Thus, the assembly process can be fully automated, using, for example, an assembly robot.

For assembling the chassis, no assembly instructions are required since the assembly process is self-explaining as the shapes of the recesses in the chassis correspond to the contours of the components to be inserted.

The weight of the chassis is substantially reduced relative to conventional chassis. According to a practical example, the weight can be reduced by a factor of 15–20.

The chassis provides for good acoustical insulation, since it surrounds any noise generating components.

Air ducts can be formed in the chassis such that a concentrated air stream can be directed to any heat generating components and thus provide for efficient cooling.

The components in the device are protected from mechanical shocks or vibrations since the chassis material has a damping function.

Due to the shock-absorbing function of the chassis, the requirements regarding shock-proof packing of the device during transportation are reduced. Consequently, a great amount of packing material during transportation can be saved, resulting in a smaller transport volume and reduction of potentially ecologically damaging materials.

The disassembly is as simple and easy as the assembly, which is advantageous for a quick and simple exchange of defective components.

The chassis does not have sharp edges or corners, thus reducing the risk of injuries.

Even though it is known in connection with an electronic device (Hewlett-Packard Model No. HP 8118A "Pulse Pattern Generator") to surround the ventilator for cooling certain electronic components with an enclosure made of polyurethane foam, this prior art is based on a different concept than the present invention: The purpose of the polyurethane casing is to absorb the sound generated by the ventilator. The remaining components of this known device are fastened to the metal chassis in the conventional manner using fastening elements. This prior art has therefore no relationship to the concept of the present invention to use the plastic material as a load-bearing structure for all components of the device.

The present invention is not limited to electronic devices such as computers or measuring instruments, but it can be used for any type of devices which comprise several components which are to be held at a fixed position, for example for optical instruments or for analytical instruments such as chromatographs.

If the chassis carries electronic components, it is preferred to provide the chassis with electrically conductive material to avoid electrostatic charging.

In a preferred embodiment of the invention, the chassis is manufactured in a fast and cost-effective way by molding from a plastic material which can be foamed. In that way, all recesses for receiving the components can be manufactured by a single forming step. At the same time, it is possible to form ventilation ducts. An alternative for cooling could be to provide a tube system in the chassis for circulation of a cooling agent and a heat exchanger for dissipating heat from the cooling agent. The tube system could simply be embodied as channels molded in the plastic material of the chassis.

The recesses for receiving the components can be provided in different planes, one above the other, so that the components can be arranged not only one beside the other, but also one above the other. This permits a space-saving arrangement of the components.

An advantageous plastic material is expanded polypropylene. It is a lightweight material, can be readily molded into various shapes, is shock-absorbing and yet has dimensional stability. Furthermore, polypropylene is temperature-stable and chemically resistant. Also, it can be completely recycled and is thus economically beneficial. A further contribution to environmental protection is that the chassis of the invention does not require compound materials, such as coated metals or plated plastic, so that easy recycling is possible. Polypropylene is not the only possible chassis material. Alternative materials like polyurethane and polyethylene can also be used.

BRIEF DESCRIPTION OF THE DRAWINGS

Subsequently, the invention is described in detail with reference to the drawings wherein:

FIG. 3 shows the lower part of the chassis according to FIG. 1, wherein the components have been removed.

DETAILED DESCRIPTION OF THE PREFERRED EMBODIMENTS

Figure 1:
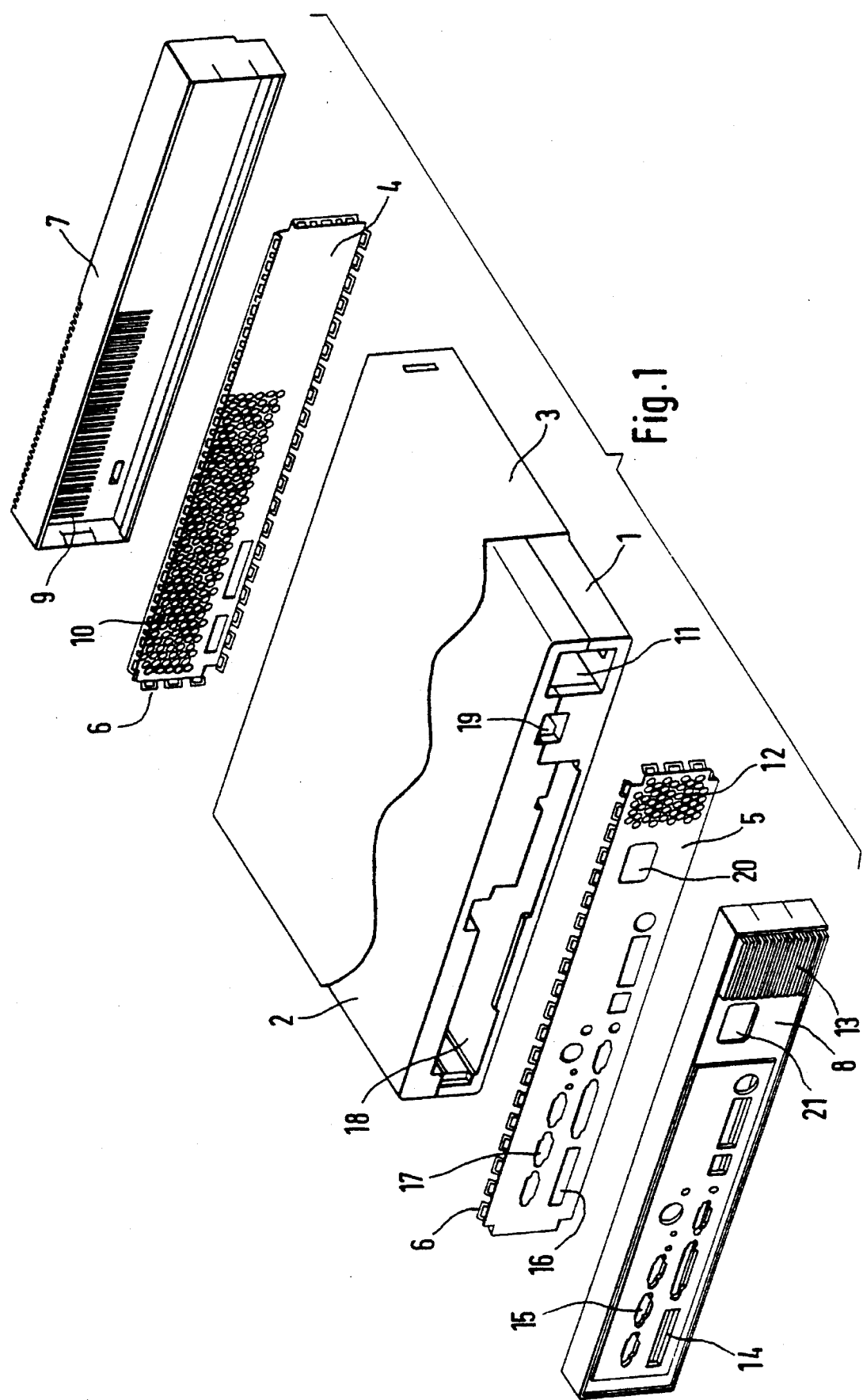
FIG. 1 shows in a partially exploded view a device with a chassis according to the invention.

FIG. 1 shows in a partially exploded view an example of a device having a chassis in accordance with the present invention. The device shown is a workstation computer for processing and storing digital data which typically comprises, among other components, a data processing arrangement, a data storage disk, and a power supply. The support unit of the chassis comprises a lower part 1 and an upper part 2 which are both made of plastic material. The chassis 1, 2 is surrounded by a metal enclosure 3 which is open at its front face and at its rear face such that the chassis can be put into the enclosure through one of these two openings. In FIG. 1, the rear portion of the metal enclosure 3 has been left out in order to show the chassis 1, 2 more clearly. A front shielding plate 4 and a rear shielding plate 5, typically made of metal, cover the front and rear surfaces of the chassis, respectively. A front cover plate 7 and a rear cover plate 8, typically made of a hard plastic material, are arranged in front of the shielding plates 4 and 5, respectively. For mounting the shielding plates and cover plates to the device, the shielding plates 4 and 5 are first inserted in the cover plates 7 and 8, respectively, and thereafter the joint plates 5,8 and 4,7, respectively, are connected to the enclosure 3 by snap-action by means of the resilient fastening elements 6.

The front cover plate 7 has venting slots 9 through which cooling air can be drawn into the interior of the device. The front shielding plate 4 has corresponding openings 10 so that the air can get into the device through an opening of the chassis 1, 2 (shown in FIGS. 2 and 3). The air which has been warmed up in the interior of the device leaves the chassis 1, 2 through an opening 11 and thereafter streams to the outside through openings 12 in the rear shielding plate 5 and slits 13 in the rear cover plate 8.

The rear cover plate 8 also comprises several openings 14, 15, etc. in which plugs or sockets are arranged and through which the device can be connected to other devices, such as CRT screens, computers, printers. As can be seen from FIG. 1, corresponding openings 16, 17 are also provided in the rear shielding plate 5. The chassis 1, 2 comprises a relatively large rear chassis opening 18 at the location of the openings 14, 15. It would, however, also be possible that the chassis has plurality of small openings instead of the rear chassis opening 18. The openings 19, 20 and 21 are provided for insertion of the mains plug which will be shown in more detail in FIG. 2.

Figure 2:
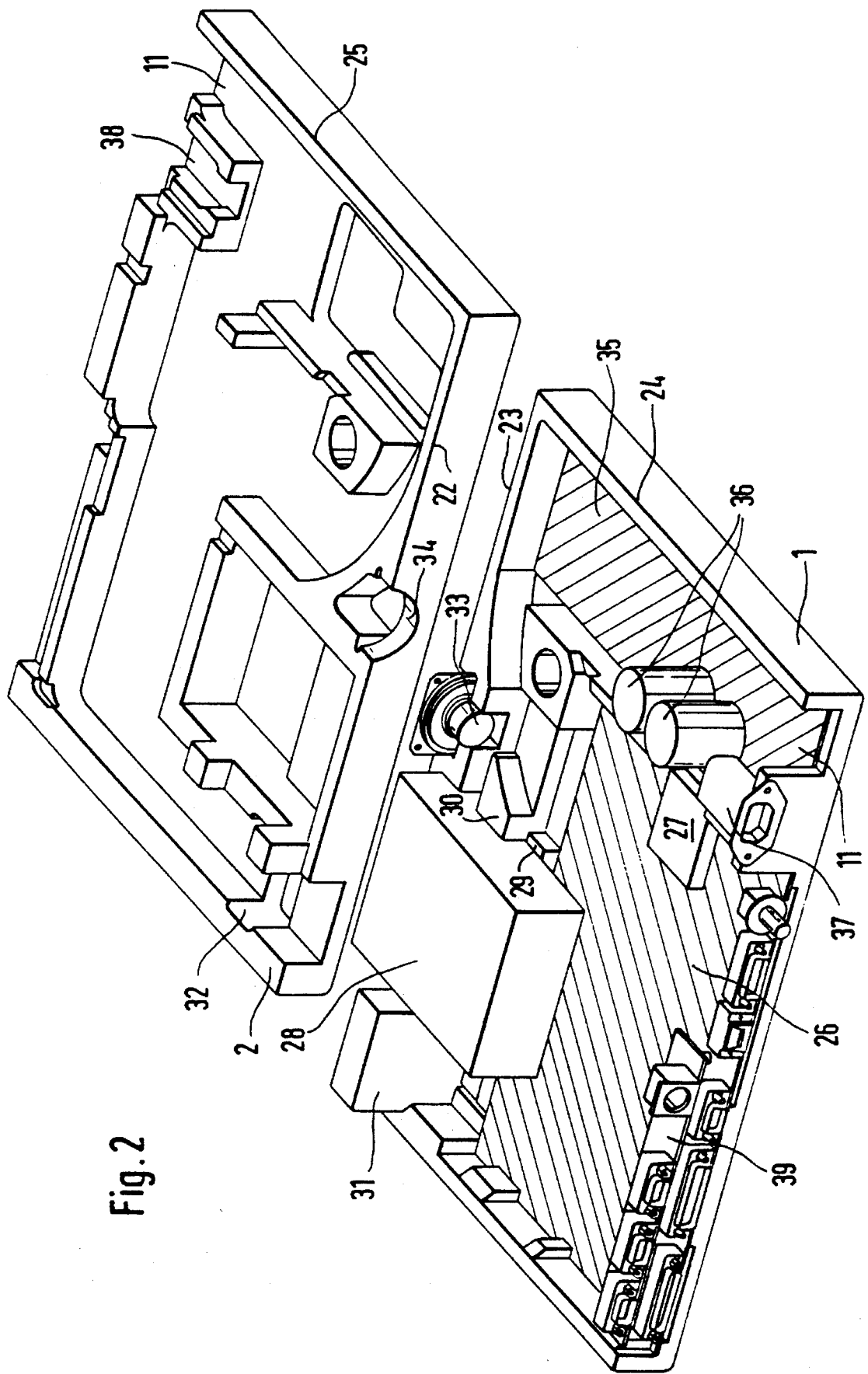
FIG. 2 is a more detailed view of the chassis according to FIG. 1 and the components contained therein, with the upper part being removed from the lower part.

FIG. 2 shows the chassis according to FIG. 1 in more detail in a perspective view. The upper part 2 of the chassis is shown to be removed from the lower part 1. In the lower part 1 of the chassis, a plurality of electronic and electro-mechanic components are inserted as will be explained below. The upper part 2 consists entirely of plastic material and comprises a plurality of recesses and other structures such that the lower part 1 and the upper part 2 fit together when the chassis is assembled. For assembling the chassis, the upper part 2 is placed on top of the lower part 1 by turning the upper part around an axis along the edge 22 by 180 degrees and then putting it on top of the lower part. Thus, in the assembled state, the components in the lower part 1 are covered by the upper part 2. When the upper part 2 is placed on top of the lower part, the opening 11 as shown in FIG. 1 is formed by the recesses in the upper part and in the lower part designated with the reference numeral 11. In the present embodiment of the invention, the parts 1 and 2 are separate from each other. It would, however, also be possible that the two parts are connected to each other, for example along the edges 22 and 23, or 24 and 25. The connection between the two parts could be accomplished through the plastic material of which the parts consist, i.e., connection would be formed in the molding process for the plastic parts. When the two parts are connected, the upper part may be folded upwards from the lower part like a hinge.

Subsequently, the lower part 1 and the components inserted therein are described in more detail. As is shown in FIG. 2, a printed circuit board 26 comprising a processor unit 27 is inserted in the lower part 1. In addition to the processor unit 27, a plurality of other electronic elements are arranged on the board 26. For the sake of clarity, however, such elements have been omitted in the drawing. The shape of the board 26 has been indicated by hatching. The board 26 fits into a corresponding recess in the plastic material of the part 1. This will be further explained below with reference to FIG. 3.

A further component inserted in the part 1 is a data storage disk which is shown as block 28. This block lies in a corresponding recess of the plastic material, which is hidden by the block 28, but which will be described and shown with reference to FIG. 3. In FIG. 2, only the shoulder portion 29 of the plastic part 1 can be seen on which the block 28 rests as well as the portion 30 of the plastic part 1 which laterally secures the block 28. The shoulder portion 29 and the remaining portions of the plastic part 1 on which block 28 is arranged have such a height that the front part of the block 28 is arranged above the printed circuit board 26. That means, the supporting planes for the board 26 and for the block 28 are arranged one above the other. In that way, a space-saving arrangement of the components in the device can be achieved. It is understood that for the assembly of the device, the board 26 is first inserted and thereafter the block 28.

A further component of the device is a ventilator 31 which draws in air from the outside through venting slots 9 (see FIG. 1) and which provides a stream of cooling air through the interior of the device and thereafter to the outside through opening 11. The ventilator 31 is arranged in a form-fitting manner in corresponding recesses in the lower part 1 and in the upper part 2. The recess in the upper part is designated with reference numeral 32. Also arranged in the front part of the chassis is a loudspeaker 33 which fits into corresponding recesses, such as recess 34 in the upper part 2 of the chassis. A power supply board 35 (indicated by hatching) with several electronic elements, for example capacitors 36, is also inserted in the chassis. A socket and line filter 37 is held in place in a fitting recess in the chassis, part of which is the recess 38 in its upper part 2. Finally, a plug arrangement 39 is inserted at the rear face of the chassis providing for electric connections to other devices. As an alternative to a separate plug arrangement, the plugs can also be permanently fixed to the board 26 so that for the assembly of the device, only a single component, i.e., the board 26 with the attached plug arrangement 39, has to be inserted into the chassis.

In the present embodiment, the electrical connections between the individual components arranged in the chassis, for example between the power supply board 35 and the socket and line filter 37, or between the block 28 and the board 26 are made by wires or cables. The cables are already pre-assembled on the components and furnished with a socket or plug which can be inserted into the component to which an electrical connection has to be made. For the sake of clarity, the cables have not been shown here. As an alternative to connection with electric cables, it would also be possible to use optical fibers for transmitting signals between the components. A further possibility for connecting the components would be to use standardized connectors associated with the components, respectively, or a data bus system.

For assembling the device shown in FIG. 1, the following steps are performed: First, the components like the board 26, the power supply board 35, and the plug arrangement 39 are assembled, whereby the plug arrangement 39 can be permanently fixed to the board 26. Then, these components are inserted into the corresponding recesses in the lower part 1 of the chassis. What is important is that the components are held in place in the chassis in a form-fitting manner without requiring any fastening elements or other connection technique such as welding or soldering. Thus, the assembly of the device is substantially simplified. In particular, no tools are required for the assembly step just mentioned and the assembly time is reduced considerably. Once the components have been inserted, either manually or by means of a robot, the upper part 2 of the chassis is placed on the lower part 1, then the chassis 1, 2 is inserted into the metal enclosure 3, and finally, the shielding and cover plates 4, 5, 7, 8 are attached by snap-action.

FIG. 3 shows the lower part 1 of the chassis according to FIG. 2, with all the components shown in FIG. 2 being removed. Thus, FIG. 3 shows the chassis before the assembly. The part 1 is manufactured in a single piece from plastic material, for example by a molding process. FIG. 3 demonstrates how the components of the device are held in the plastic part 1. First, it is explained how the board 26 is held by the chassis: The edges of the board 26 lie upon the surfaces 41a, 41b, 41c, 41d, 41e, and 41f. All these surfaces are arranged in a common plane which is somewhat elevated from the bottom of the part 1. The reason for this elevation is to provide some clearance for parts of the board 26 which project downwards. The board 26 is held laterally by vertical walls in the plastic material which are arranged perpendicularly to the plane defined by the surfaces 41a–f. Such vertical walls are denoted with reference numerals 42a, 42b, 42c, 42d. The walls 42a and 42d furthermore comprise projections 60a, 60b, 60c which mate with corresponding recesses in the printed circuit board 26 and thus contribute to the position fixation of the board 26 in the chassis.

The block 28 lies on the horizontal shoulder portion 29, elevated from the plane defined by surfaces 41a–e. The block 28 is laterally held by the walls 43a, 43b, 43c. The ventilator 31 is inserted in the recess 44 which fits its contours. Similarly, the loudspeaker 33 is arranged in a form-locking manner in the recess 45. The power supply board 35 rests on the supporting surfaces 46a–g and is laterally enclosed by vertical walls such as 47a and 47b. The socket and line filter 37 fits into the recess 48.

Also indicated in FIG. 3 is the air stream in the interior of the device produced by the ventilator 31. A part 51 of the stream flows across the circuit board 26 through an air duct formed by the chassis elements 30, 40 and 55, 56. Another part 50 of the air stream flows through air duct formed by chassis elements 30, 55 and 55, 56. From there, both streams flow through the compartment in which the power supply board 35 is arranged to the outside via opening 11. It is understood that the lower part 1 or the upper part 2 of the chassis may comprise additional elements which form air ducts in order to direct cooling air to electronic elements which have to be cooled.

As an alternative to cooling with an air stream as in the shown embodiment, it would also be possible to design the chassis completely enclosed without air exchange with the environment and to provide a tube system in the chassis wherein a cooling agent is circulating. The tube system would be connected to a micro heat exchanger for dissipating heat from the coolant agent to the environment. The tube system can be provided in the chassis material, i.e., the chassis can be molded with integrated channels forming the tube system.

As mentioned above, the lower part 1 and the upper part 2 of the chassis are completely made of a plastic material. The chassis preferably is manufactured as a molded piece using a form which is the negative matrix of the structures in the lower and the upper part of the chassis, for example the structures shown in FIG. 3. An alternative method for producing structures like those shown in FIG. 3 would be milling the desired structures out of a solid plastic material.

The molding process is of course advantageous with regard to speed and cost efficiency.

The plastic material for the chassis may be, for example, expanded polypropylene (EPP). This material as such is known, and is used as, for example, packing material. For the production of a EPP chassis according to the present invention, the following steps are performed: First, the polypropylene granules are foamed up according to a known method to produce polypropylene beads. The granules contain carbon which ensures that the final plastic material has an electric conductivity sufficient to avoid electrostatic charging of the chassis. Then, the beads are blown with a pressure of about 4 bar into the form, whereby the form corresponds to the desired structures in the chassis. This step leads to a volume reduction. In the subsequent step, vacuum is applied so that the volume increases again and the beads assume the shape of the form. Then, hot water vapor of about 180 degrees centigrade is blown in, causing coalescence of the beads at their surfaces (cross-linkage). After that, the form is opened and the foam part is removed. Finally, the formed part is tempered.

Expanded polypropylene has several advantageous properties which make it suitable as the plastic material for a chassis according to the invention. For example, it has high-dimensional stability, and yet it is resilient and thus energy absorbent. This ensures a shock-absorbing mounting of the components in the chassis. The deformability or resilience of the plastic material can be influenced by the density of the material. According to a practical example of a chassis, the density of the polypropylene is in a range of about 60 to 80 grams/liter which provides good dimensional stability and at the same time a good shock-absorbing effect. The density range of 25–80 grams/liter may also be used for certain applications. By varying the density, the hardness and the shock-absorbing characteristics can be adjusted to the specific application: the smaller the density, the softer the material, resulting in better shock-absorbing quality. Another advantage of polypropylene is its temperature stability which is important when the components carried by the chassis develop a large amount of heat. It has been found out, however, that during continuous operation, the temperature of the components in a chassis of the invention is even somewhat lower than in a conventional device having the same components. The reason is that due to the air ducts which can be formed in the chassis, a more directed stream of cooling air can be produced. Another advantage of polypropylene is that it can be completely recycled.

It is understood that expanded polypropylene is not the only possible plastic material having advantageous properties which make it suitable for use as a chassis according to the invention. Other plastic materials with dimensional stability and a certain resilience can also be used as the chassis material. Alternative materials, even though not quite as satisfactory as polypropylene in all respects, are polyurethane or polyethylene. Particularly plastic materials which are moldable in order to produce the chassis in one (or two) part(s) are preferred.

The term "plastic material" used herein denotes a light material having shock-absorbing quality and dimensional stability, and is preferably a synthetic, moldable material. It is understood, however, that the concept of the invention could also be realized with materials of biological origin.

If any inflammable plastic material is used for the chassis and if the components in the chassis may generate a hazardous amount of heat when a malfunction of the device occurs, for example if the ventilator fails, a fire precaution can be to provide a carbon dioxide cartridge within the device. Such a carbon dioxide cartridge is coupled to a heat sensor which senses the temperature and causes the carbon dioxide to be released if a certain temperature is exceeded, so that any fire or smouldering is extinguished.

The embodiment described above in connection with FIGS. 1–3 is only one of many possible examples how the invention can be realized. It is a specific arrangement of electro-mechanical components. In a device wherein other components are used, particularly if they have different contours (e.g., larger or smaller printed circuit boards), the chassis would have to be designed such that these components fit into the chassis in a form-locking manner. The components shown in FIG. 2 are those which are typically used in a workstation computer, but it is understood that the invention can be realized with any type of components which need not necessarily be of electric or electromechanical nature. For example, optical components could also be provided in the chassis, or purely mechanical components. Thus, it would be possible to provide metal sheets at one or several locations in the chassis to shield components which radiate disturbing electromagnetic waves. Such a sheet would be placed in a corresponding recess of the plastic chassis.

The invention cannot only be used in computers or other data processing devices, but in many different kinds of devices. For example, it can be used in electronic devices or instruments, such as signal sources, test and measuring devices, e.g., oscilloscopes, spectrum analyzers, multimeters, and in devices of medical electronics. Furthermore, the invention can be used in devices for entertainment electronics (audio, video), and in household appliances. A further field of use for the invention are lightwave test equipment, such as optical reflectometers, and optical signal sources. In optical instruments, the invention has the additional advantage that any disturbing effects of background radiation can be avoided, since components sensitive to such radiation can be enclosed by appropriate design of the chassis such that background radiation cannot impinge on them. Such unwanted background radiation in prior art devices may, for example, originate from light reflections from walls or other parts in the device. The suppression of background radiation is still improved if the chassis is provided with dark (light-absorbing) material such as carbon which, in an embodiment of the invention, is anyhow used to prevent electrostatic charging of the chassis.

Another field of use is that of equipment for analytical chemistry. For example, a chassis according to the invention could be used in a liquid chromatograph to carry its components, such as pumps, syringes, valves, control and data processing units, detector. The channels for the liquids can be formed in the chassis material by the molding process, so that no tubes as in conventional chromatographs are required. Using polypropylene as the chassis material is particularly advantageous since it is chemically inert to the solvents typically used in liquid chromatography.

For all the above-mentioned devices, the invention provides a light-weight, shock-absorbing chassis which is easy to manufacture and which ensures a simple assembly of the components. Equally simple as the assembly is the disassembly of such a device which may be required for repairing the device. Such disassembly is accomplished just by taking the components out of the chassis. Except for opening an enclosure of the chassis, for example a metal enclosure, no tools are required.

What is claimed is:

1. A chassis of a device, the device comprising:

a plurality of functionally interconnected components disposed in the chassis, the chassis comprising a support unit made of resilient plastic material, the support unit having inner contacting surfaces forming recesses which fit the outer shapes of corresponding components such that the components are held in the support unit by elastic and frictional forces created between the inner contacting surface of a recess and an exterior surface of a corresponding component, wherein the recesses are arranged such that one or more cooling paths are formed in the chassis by the components and the support unit when the components are inserted therein, said one or more cooling paths providing for a flow of cooling fluid circulated throughout the chassis.

2. A chassis as in claim 1, the support unit further having one or more cooling apertures, said one or more cooling apertures in flow communication with said one or more cooling paths and a flow of cooling fluid external of the support unit such that the cooling fluid flows into said one or more cooling apertures and along said one or more cooling paths for cooling the components.

3. A chassis of a device, the device comprising a printed circuit board and a plurality of components functionally interconnected with the circuit board disposed in the chassis, the chassis comprising a support unit made of resilient plastic material, the support unit having inner contacting surfaces forming recesses, one of the recesses fitting the outer shape of the printed circuit board and each one of the remaining recesses fitting the outer shape of a corresponding component such that the printed circuit board and components are held in the support unit by elastic and frictional forces created by the deformation of the inner contacting surfaces by an exterior surface of the circuit board and the components disposed in corresponding recesses.

4. A chassis as in claim 3, wherein the device is an optical reflectometer, said support unit further having electrically conductive material which is sufficiently conductive to prevent electrostatic charging.

5. A chassis as in claim 3, wherein the device is a liquid chromatograph.

6. A chassis as in claim 3, wherein the recesses are arranged such that one or more cooling paths are formed in the chassis by the components and the support unit when the components are inserted therein, said one or more cooling paths providing for a flow of cooling fluid circulated throughout the chassis.

7. A chassis as in claim 6, the support unit further having one or more cooling apertures, said one or more cooling apertures in flow communication with said one or more cooling paths and a flow of cooling fluid external of the support unit such that the cooling fluid flows into said one or more cooling apertures and along said one or more cooling paths for cooling the components.

8. A chassis according to claim 3, wherein the dimensions of a corresponding recess is slightly smaller than the dimensions of a corresponding one of the printed circuit board and the components.

9. A chassis according to claim 3, said support unit further having electrically conductive material disposed thereon which is sufficiently conductive to prevent electrostatic charging.

10. A chassis according to claim 3, wherein the support unit comprises a lower part into which the circuit board and components are inserted when assembling the chassis and an upper part for covering the lower part, wherein the recesses are formed in different planes of the lower part, one plane being substantially above the other, so that components may be substantially stacked one above the other.

11. A chassis according to claim 3, wherein the plastic material has a density of about 60–80 g/l.

12. A chassis according to claim 3, wherein the plastic material is expanded polypropylene.

13. A chassis according to claim 3, wherein the chassis is enclosed in a metal housing.

* * * * *